United States Patent
White

(10) Patent No.: US 6,793,542 B1
(45) Date of Patent: Sep. 21, 2004

(54) CLAMP-JAW CONTACT ASSEMBLY AND METER SOCKET EMPLOYING THE SAME

(75) Inventor: Percy A. White, Murphy, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 10/621,917

(22) Filed: Jul. 17, 2003

(51) Int. Cl.$^7$ ............................................. H01R 11/24
(52) U.S. Cl. ...................................... 439/822; 439/858
(58) Field of Search ................................. 439/843, 858, 439/845, 864, 822, 819, 850, 852, 856, 861, 833, 839

(56) References Cited

U.S. PATENT DOCUMENTS

| | | | |
|---|---|---|---|
| 3,003,085 A | * 10/1961 | Rund | .......................... 439/370 |
| 3,281,550 A | 10/1966 | Waldrop | |
| 3,764,956 A | * 10/1973 | Norden | .......................... 439/858 |
| 4,388,670 A | 6/1983 | Billhartz | |
| 4,532,574 A | 7/1985 | Reiner et al. | |
| 5,334,057 A | * 8/1994 | Blackwell | .......................... 439/839 |
| 5,775,942 A | 7/1998 | Jeffcoat | |
| 5,980,311 A | 11/1999 | Campbell et al. | |
| 6,275,168 B1 | 8/2001 | Slater et al. | |
| 6,478,589 B2 | * 11/2002 | Robinson et al. | .......................... 439/146 |
| 6,561,844 B1 | 5/2003 | Johnson | |
| 6,565,394 B2 | 5/2003 | Seff et al. | |

* cited by examiner

*Primary Examiner*—Renee Luebke
*Assistant Examiner*—Felix O. Figueora
(74) *Attorney, Agent, or Firm*—Martin J. Moran

(57) ABSTRACT

A clamp-jaw contact assembly includes a stationary contact adapted to engage a meter socket cavity. A moveable contact is adapted to engage a meter bayonet. A unitary spring/pivot wire-formed U-shaped member pivotally mounts the moveable contact to the stationary contact and is adapted to bias the moveable contact toward the stationary contact upon insertion of the meter bayonet therebetween.

18 Claims, 4 Drawing Sheets

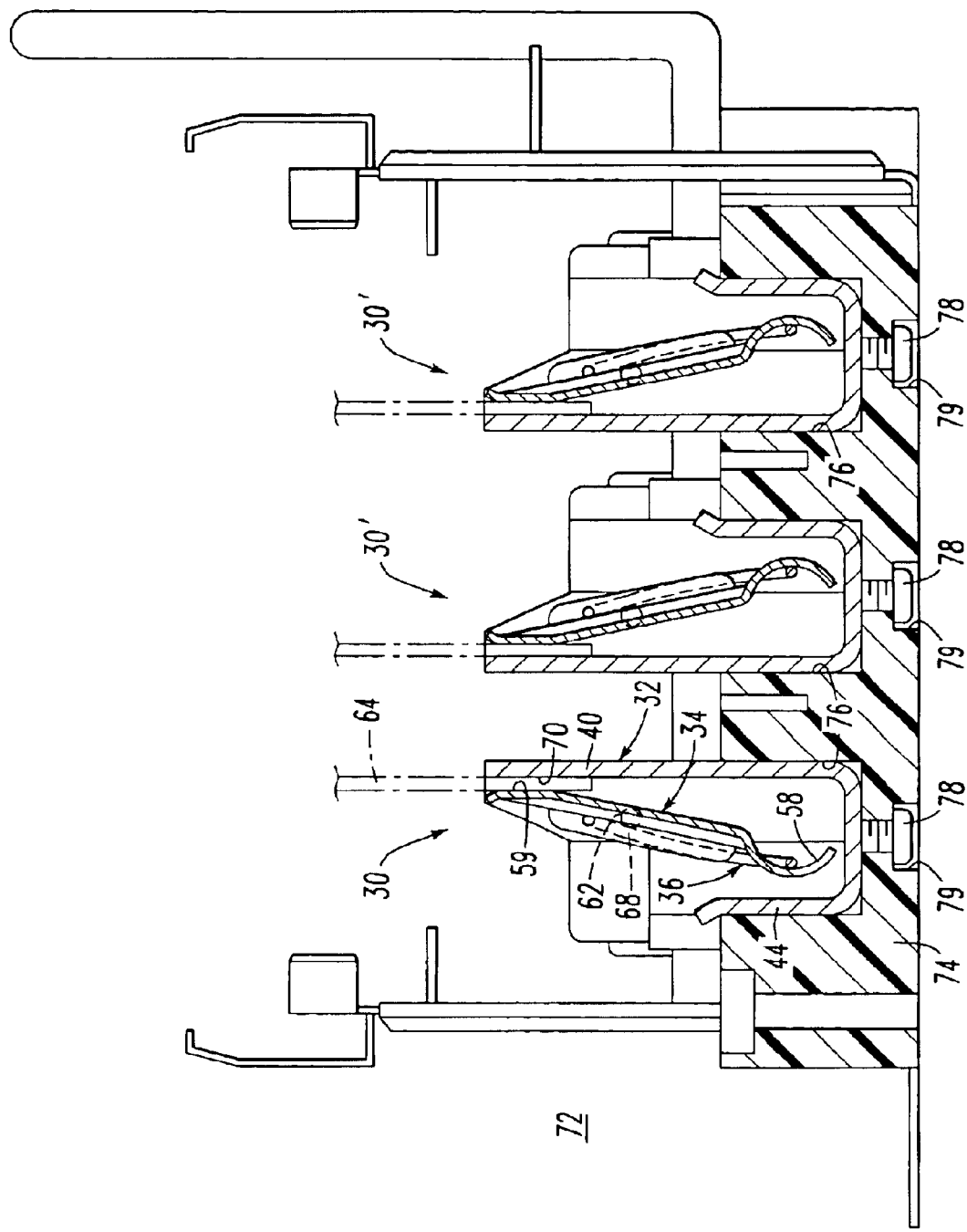

CLAMP-JAW CONTACT ASSEMBLY AND METER SOCKET EMPLOYING THE SAME

BACKGROUND OF THE INVENTION

1. Field of the Invention

The present invention relates generally to contact assemblies and, more particularly, to a clamp-jaw contact assembly, such as for a watt-hour meter socket. The invention also relates to meter sockets employing clamp-jaw contact assemblies.

2. Background Information

Watt-hour meters are typically used by electric utilities to measure electrical consumption in residential, commercial and industrial applications. To accommodate the watt-hour meter, equipment is provided with a watt-hour meter socket. Such a meter socket contains a plurality of "meter jaws" to accept bayonet stabs or contacts on the base of the watt-hour meter.

Meter sockets having locking jaws for receiving the bayonet or blade contacts of a watt-hour meter are well known. See, for example, U.S. Pat. No. 3,281,550. Meter sockets are generally located in a rectangular enclosure having an opening in a top panel for receiving line cables and an opening in a bottom panel for receiving load cables. The meter socket is mounted to a back panel of the enclosure. A removable front panel has an opening for receiving the dome portion of the meter, which extends therethrough when coupled to the meter socket.

A typical residential meter socket is of the "plug-in type" in which the bayonet stabs on the meter are retained and clamped to corresponding meter jaws using the inherent spring pressure of the meter jaws. For some residential applications, and for the majority of commercial and industrial applications, a "clamp-jaw" type of meter socket is employed. In the clamp-jaw type meter socket, the clamping force of the jaws upon the meter bayonets is enhanced by the addition of a spring, such as a straight beam spring or a coil spring.

In a typical construction, the meter jaw assembly includes a stationary jaw or contact, and a moveable or pivoting jaw or contact. The moveable jaw, with the aid of the aforementioned spring, exerts pressure on the corresponding meter bayonet, thereby clamping it to the stationary jaw.

U.S. Pat. No. 5,775,942 discloses a meter socket employing a plurality of jaw-type contact assemblies including a stationary contact, a moveable contact and a conductor terminal.

FIG. 1 shows a prior clamp-jaw assembly 2, which generally includes three component parts: a stationary contact 4 (as best shown in FIG. 2), a moveable contact 6 and a conductor terminal (not shown). The stationary contact 4 is preferably a one-piece construction including an elongated body 8 and a generally unshaped bottom portion 10 having a vertical extension member 12 and a conductor terminal interface 13. The elongated body 8 includes a pair of wings 14, which extend perpendicular to the elongated body 8. Preferably, the stationary contact 4 is stamped and bent into shape from a single piece of conductive metal, such as copper.

The moveable contact 6 is pivotably mounted to the stationary contact 4 by a pivot pin 16. The moveable contact 6 is also preferably a one-piece construction. The moveable contact 6 includes a back portion 18 having a pair of wings 20 (only one of the wings 20 is shown) extending substantially perpendicular to the back portion 18. A low portion 22 of the moveable contact 6 is bent for receiving a biasing mechanism, such as a spring 24, to bias a portion 26 of the moveable contact 6 to be in a clamped position with respect to the elongated body 8 of the stationary contact 4.

Known technology for jaw-type contact assemblies typically employs both a spring and a separate machine driven tubular steel rivet to accomplish the respective clamping and pivoting actions. However, the rivet must be installed by a rivet setting machine or else staked manually, in order to retain the rivet in the jaw-type contact assembly. Also, a beam spring or coil spring is separately installed in that assembly in order to provide the desired clamping force.

There is room for improvement in clamp-jaw contact assemblies.

There is also room for improvement in watt-hour meter sockets and in meter socket clamp-jaw contact assemblies.

SUMMARY OF THE INVENTION

These needs and others are met by the present invention, which combines both spring clamping force and pivot functions in a unitary spring/pivot member, which may be assembled in a meter socket clamp-jaw contact assembly without the need for a machine operation.

As one aspect of the invention, a clamp-jaw contact assembly comprises: a stationary contact adapted to engage a meter socket cavity; a moveable contact adapted to engage a meter bayonet; and a unitary member pivotally mounting the moveable contact to the stationary contact and adapted to bias the moveable contact toward the stationary contact.

The unitary member may be a U-shaped wire-form or a wire-formed member.

The unitary member may be a spring/pivot member having a rectangular shape with a pair of ends and an open portion therebetween.

The stationary contact may include an elongated body and a pair of sides, which extend from the elongated body; the moveable contact may include a body portion and a pair of sides, which extend from the body portion; the sides of the stationary contact and the moveable contact may have openings; the unitary member may be a spring/pivot member having a first end, which passes through a first pair of the openings of a first pair of the sides of the stationary contact and the moveable contact; and the spring/pivot member may have a second end, which passes through a second pair of the openings of a second pair of the sides of the stationary contact and the moveable contact.

The unitary member may be a spring/pivot member having a first end, a second end and an opening therebetween; the stationary contact may include first and second openings; the moveable contact may include first and second openings; the first end of the spring/pivot member may engage the first openings of the stationary contact and the moveable contact; and the second end of the spring/pivot member may engage the second openings of the stationary contact and the moveable contact.

The unitary member may be a spring/pivot member having a general U-shape including a pair of ends disposed from a pair of sides disposed from a bias member, with the pair of ends pivotally mounting the moveable contact to the stationary contact. The stationary contact may include a surface. The moveable contact may include a first portion, which is pivotally mounted to the stationary contact, and a second portion proximate the surface of the stationary contact and adapted to be biased by the bias member of the spring/pivot member.

The stationary contact may be elongated and include a pair of protrusions. The sides of the spring/pivot member may engage the protrusions of the stationary contact. The moveable contact may pivot about the ends of the spring/pivot member. The second side of the second portion of the moveable contact may engage the bias member of the spring/pivot member, in order to maintain the moveable contact in a clamped position with respect to the stationary contact.

As another aspect of the invention, a meter socket clamp-jaw contact assembly comprises: a stationary contact; a moveable contact; and a unitary spring/ pivot member pivotally mounting the moveable contact to the stationary contact and adapted to bias the moveable contact toward the stationary contact.

As another aspect of the invention, a meter socket comprises: a socket block including a plurality of cavities recessed therein; and a plurality of clamp-jaw contact assemblies mounted in the cavities of the socket block, each of the contact assemblies comprising: a stationary contact engaging a corresponding one of the cavities; a moveable contact adapted to engage a meter bayonet; and a unitary member pivotally mounting the moveable contact to the stationary contact and adapted to bias the moveable contact toward the stationary contact

BRIEF DESCRIPTION OF THE DRAWINGS

A full understanding of the invention can be gained from the following description of the preferred embodiments when read in conjunction with the accompanying drawings in which:

FIG. 7 is a cross-sectional view of a meter socket assembly as taken through three load end clamp-jaw contact assemblies, including the clamp-jaw assembly of FIG. 3, in accordance with an embodiment of the present invention.

DESCRIPTION OF THE PREFERRED EMBODIMENTS

The present invention is disclosed in connection with a clamp-jaw assembly for a watt-hour meter socket assembly. However, it will be appreciated that the invention is applicable to a wide range of clamp-jaw contact assemblies, which provide electrical connection to bayonet stabs, contacts or other types of electrical connections.

Figure 2:
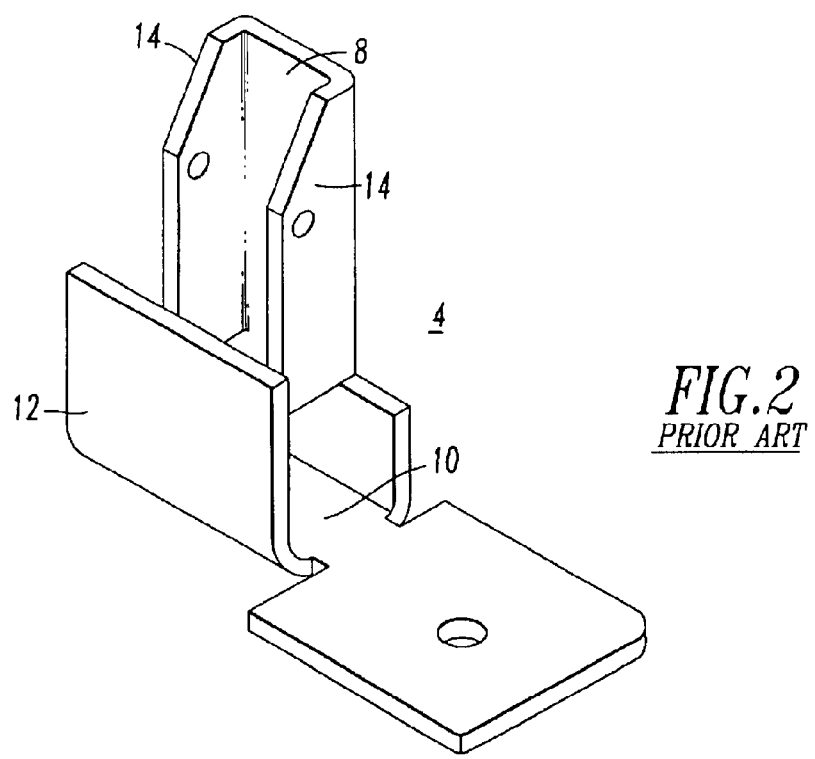
FIG. 2 is an isometric view of the stationary contact of FIG. 1.
Figure 3:
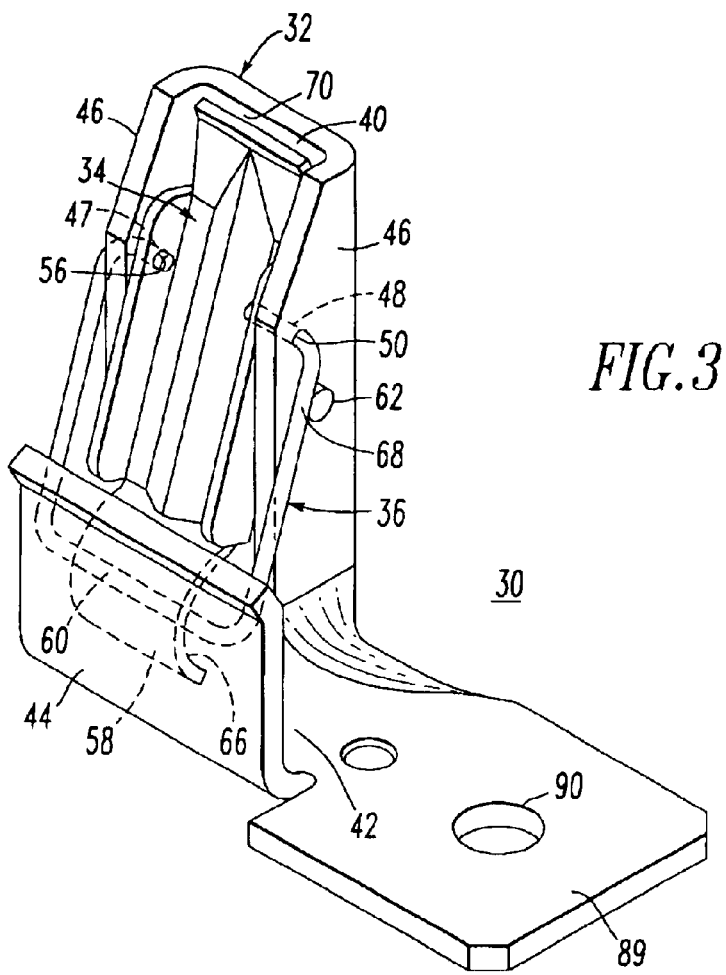
FIG. 3 is an isometric view of a watt-hour meter clamp-jaw assembly in accordance with the present invention.
Figure 4:
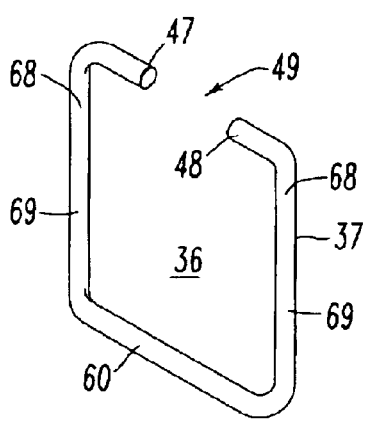
FIG. 4 is an isometric view of the spring/pivot member of FIG. 3.
Figure 5:
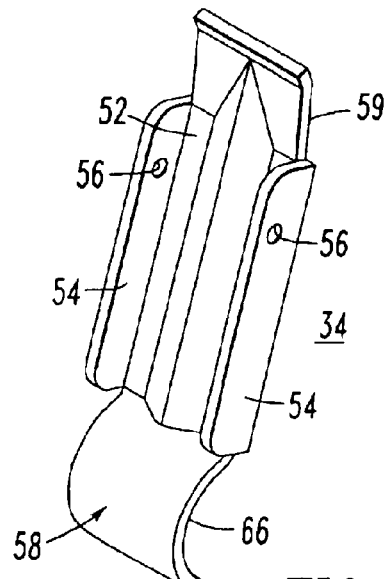
FIG. 5 is an isometric view of the moveable contact of FIG. 3.

Referring to FIG. 3, a clamp-jaw assembly 30 of the present invention is shown. The clamp-jaw assembly 30 is suitable for use with a watt-hour meter socket, such as the meter socket assembly 72 of FIG. 7. An example of such a watt-hour meter socket is disclosed in U.S. Pat. No. 5,775,942, which is incorporated herein by reference. The assembly 30 includes a stationary contact 32, which is somewhat similar to the stationary contact 4 of FIG. 2, a moveable contact 34 (as best shown in FIG. 5) and a spring/pivot member 36 (as best shown in FIG. 4). The stationary contact 32 is preferably a one-piece construction including an elongated body 40 and a generally unshaped bottom portion 42 having a vertical extension member 44. The stationary contact 32 includes a pair of wings 46, which extend perpendicular to the elongated body 40 thereof. Preferably, each of the stationary contact 32 (e.g., made of copper) and the moveable contact 34 (e.g., made of copper or heat treated steel) are stamped and bent into shape from a single piece of conductive metal. As shown in FIG. 4, the spring/pivot member 36 is preferably formed from a suitable structure, such as a wire 37 (e.g. made of spring steel), which is bent into a square or rectangular shape having a pair of ends 47,48 with an open portion 49 therebetween.

Figure 6:
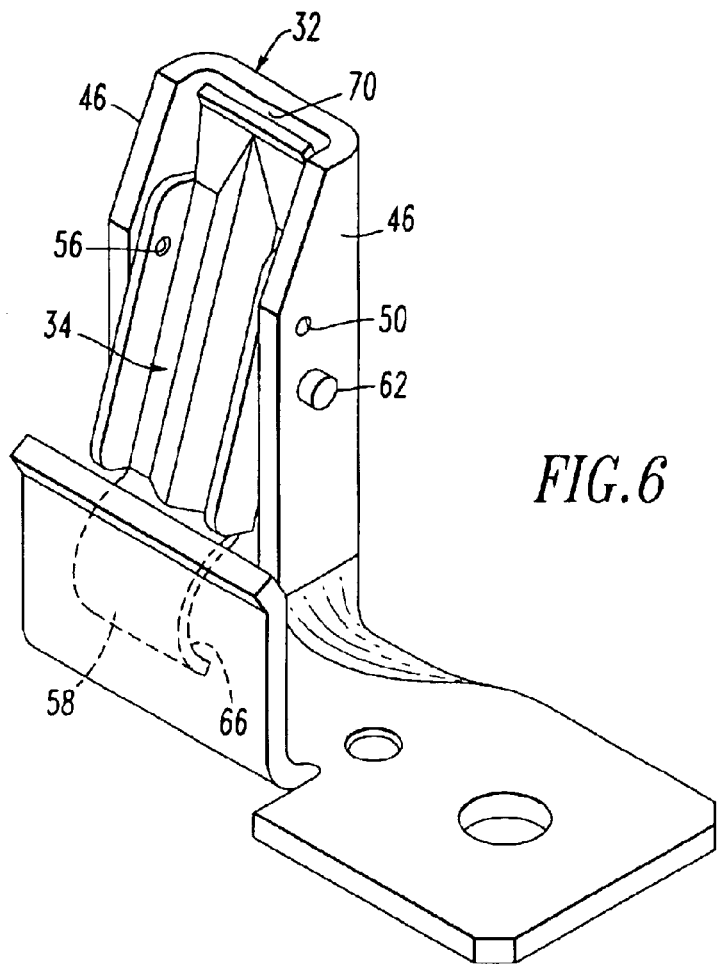
FIG. 6 is an isometric view of the watt-hour meter clamp-jaw assembly of FIG. 3 prior to the assembly of the spring/pivot member of FIG. 4.

The moveable contact 34 is pivotably mounted to the stationary contact 32 by the ends 47,48 of the spring/pivot member 36. The moveable contact 34 is also preferably a one-piece construction. The spring/pivot member ends 47,48 pass through openings 50 (only one opening 50 is shown in FIGS. 3 and 6) of the wings 46 of the stationary contact 32. The moveable contact 34 includes a back portion 52 and a pair of wings 54 extending substantially perpendicular to the back portion 52. The spring/pivot member ends 47,48 also pass through openings 56 of the wings 54 of the moveable contact 34. An arcuate low portion 58 of the moveable contact 34 is engaged by a low portion 60 of the spring/pivot member 36, in order to provide a clamped position (as best shown in FIG. 7) of the moveable contact 34 with respect to the stationary contact 32 after insertion of a meter bayonet 64 (as shown in phantom line drawing) therebetween. The center V-shaped portion of the moveable contact 34 minimizes bending or deformation of such contact.

FIG. 6 shows the relative positions of the stationary contact 32 and the moveable contact 34 before the assembly of the spring/pivot member 36 of FIGS. 3 and 4. The moveable contact 34 is first positioned between the wings 46 of the stationary contact 32. Then, with reference to FIG. 3, the low portion 60 of the spring/pivot member 36 is moved past the arcuate low portion 58 of the moveable contact 34 and proximate the opposite surface 66 thereof. Finally, the ends 47,48 are inserted within the corresponding openings 50 and 56 of the respective contacts 32 and 34.

Figure 1:
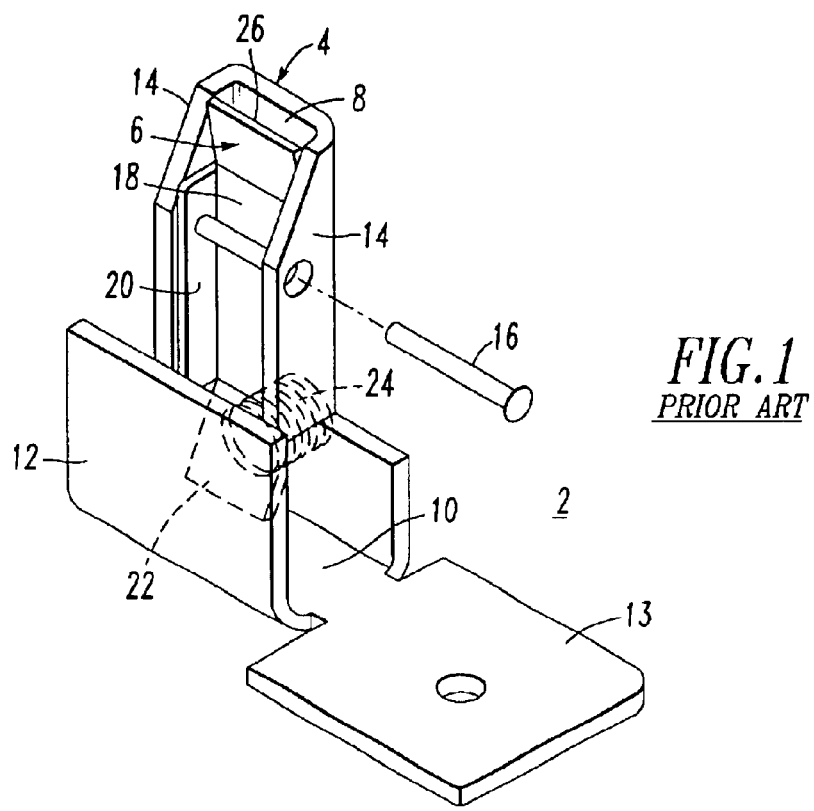
FIG. 1 is an isometric view of a watt-hour meter clamp-jaw assembly.

As shown in FIGS. 3, 6 and 7, unlike the wings 14 of the stationary contact 4 of FIG. 1, there are one or more protrusions 62 on the wings 46 of the stationary contact 32. As best shown in FIG. 7, these protrusions 62 bias the wire spring/pivot member 36, in order that the stationary and moveable contacts 32,34 are biased closed against the meter bayonet 64 (as shown in phantom line drawing). With the meter bayonet 64 in the position shown in FIG. 7, the moveable contact 34 pivots counter-clockwise (with respect to FIG. 7 and with respect to the bottom right of FIG. 3) about the ends 47,48 of the spring/pivot member 36. In turn, a surface 66 of the arcuate low portion 58 of the moveable contact 34 engages the low portion 60 of the spring/pivot member 36. As a result, upper portions 68 of the sides 69 of the spring/pivot member 36 engage the protrusions 62 of the wings 46 of the stationary contact 32. The low portion 60 of the spring/pivot member 36, thus, provides the bias to the arcuate low portion 58 of the moveable contact 34, in order to maintain the moveable contact 34 in a clamped position with respect to the stationary contact 32, with the respective surfaces 59 and 70 clamping the meter bayonet 64 as shown in FIG. 7. No additional parts are required to complete the clamp-jaw assembly.

FIG. 7 shows a cross-sectional view taken through load end clamp-jaw contact assemblies 30,30',30' of a meter socket assembly 72 formed in accordance with the present invention. The contact assemblies 30' are similar to the contact assembly 30, except that they provide a mirror-image, as shown. An insulative base or socket block 74 of the meter socket assembly 72 includes a series of cavities 76 recessed into the block for receiving each of the contact assemblies 30,30',30'. These contact assemblies are bolted to the socket block 74 using screws 78 inserted into openings 79 in a bottom portion of the block and into openings 90 (as shown in FIG. 3) of the contact assemblies.

Figure 8:
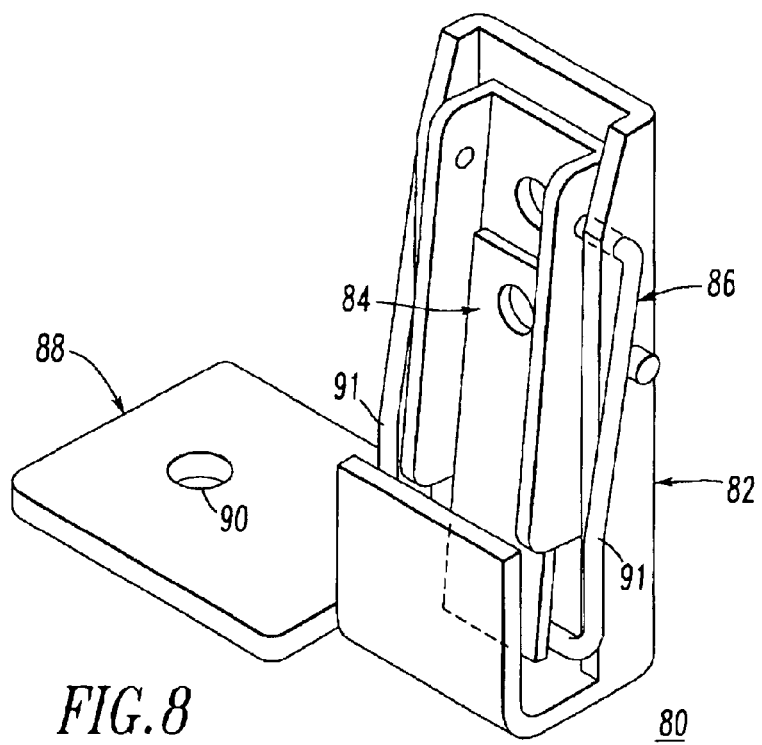
FIG. 8 is an isometric view of a watt-hour meter clamp-jaw assembly in accordance with another embodiment of the present invention.

Referring to FIG. 8, another clamp-jaw assembly 80 is shown. The assembly 80 includes a stationary contact 82, which is somewhat similar to the stationary contact 32 of FIG. 3, a moveable contact 84, which is somewhat similar to the moveable contact 34 of FIG. 3, and a spring/pivot member 86, which is somewhat similar to the spring/pivot member 36 of FIG. 3. Here, unlike FIG. 3, but like the contact assemblies 30' of FIG. 7, the stationary contact 82 has a conductor terminal interface 88, which is located on the opposite side (i.e., toward the top left of FIG. 8 rather than conductor terminal interface 89, which is located on the bottom right of FIG. 3) of the clamp-jaw assembly 80. Also, the spring/pivot member 86 has bend portions 91, which accommodate a relatively wider meter bayonet (not shown) than the meter bayonet 64 of FIG. 7.

The disclosed watt-hour meter clamp-jaw assemblies 30,30',80 eliminate a separate rivet and the resulting staking operation. A pivot mechanism is provided by shaping the spring/pivot member 36 from the wire 37, in order to provide both a pivot/clamping mechanism as well as suitable spring force in order to securely clamp the meter bayonet 64 to the surface 70 of the stationary contact 32 by the surface 59 of the moveable contact 34. The openings 50 and 56 on both the stationary and moveable contacts 32 and 34, respectively, provide a retaining mechanism for the ends 47,48 of the wire spring/pivot member 36.

Counter-clockwise rotation (with respect to FIG. 7) of the moveable contact 34 as caused by the insertion of the meter bayonet 64 between the surface 70 of the stationary contact 32 and the surface 59 of the moveable contact 34 causes the arcuate low portion 58 of the moveable contact 34 to disengage from the vertical extension member 44 of the stationary contact 32. This causes the upper portions 68 of the spring/pivot member 36 to be deflected by the protrusions 62 of the wings 46 of the stationary contact 32, which bends the member 36 and causes the low portion 60 of the spring/pivot member 36 to provide the bias (counter-clockwise with respect to FIG. 7) to the arcuate low portion 58 of the moveable contact 34. As a result, this clamps the meter bayonet 64, which is sandwiched between the surface 59 of the moveable contact 34 and the surface 70 of the stationary contact 32.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A clamp-jaw contact assembly comprising:
   a stationary contact adapted to engage a meter socket cavity;
   a moveable contact adapted to engage a meter bayonet;
   a unitary member pivotally mounting said moveable contact to said stationary contact and adapted to bias said moveable contact toward said stationary contact; and
   wherein said unitary member is a U-shaped wire-from.

2. A clamp-jaw contact assembly comprising:
   a stationary contact adapted to engage a meter socket cavity;
   a moveable contact adapted to engage a meter bayonet;
   a unitary member pivotally mounting said moveable contact to said stationary contact and adapted to bias said moveable contact toward said stationary contact; and
   wherein said unitary member is a wire-formed member.

3. A clamp-jaw contact assembly comprising:
   a stationary contact adapted to engage a meter socket cavity,
   a moveable contact adapted to engage a meter bayonet;
   a unitary member pivotally mounting said moveable contact to said stationary contact and adapted to bias said moveable contact toward said stationary contact; and
   wherein said unitary member is a spring/pivot member having a rectangular shape with a pair of ends and an open portion therebetween.

4. The clamp-jaw contact assembly of claim 3 wherein said spring/pivot member has a general U-shape including a pair of sides disposed from a bottom portion, with each of said ends being disposed from a corresponding one of said sides, and with each of said sides having a bend portion.

5. A clamp-jaw contact assembly comprising:
   a stationary contact adapted to engage a meter socket cavity;
   a moveable contact adapted to engage a meter bayonet;
   a unitary member pivotally mounting said moveable contact to said stationary contact and adapted to bias said moveable contact toward said stationary contact; and
   wherein said stationary contact includes an elongated body and a pair of sides, which extend from said elongated body; wherein said moveable contact includes a body portion and a pair of sides, which extend from said body portion; wherein the sides of said stationary contact and said moveable contact have openings; wherein said unitary member is a spring/pivot member having a first end, which passes through a first pair of the openings or a first pair of said sides of said stationary contact and said moveable contact, said spring/pivot member having a second end, which passes through a second pair of the openings of a second pair of said sides of said stationary contact and said moveable contact.

6. A clamp-jaw contact assembly comprising:
   a stationary contact adapted to engage a meter socket cavity;
   a moveable contact adapted to engage a meter bayonet;
   a unitary member pivotally mounting said moveable contact to said stationary contact and adapted to bias said moveable contact toward said stationary contact; and
   wherein said unitary member is a spring/pivot member having a first end, a second end and an open portion therebetween; wherein said stationary contact includes first and second openings; wherein said moveable contact includes first and second openings; wherein the first end of said spring/pivot member engages the first openings of said stationary contact and said moveable contact; and wherein the second end of said spring/pivot member engages the second openings of said stationary contact and said moveable contact.

7. A clamp-jaw contact assembly comprising:
   a stationary contact adapted to engage a meter socket cavity;
   a moveable contact adapted to engage a meter bayonet;
   a unitary member pivotally mounting said moveable contact to said stationary contact and adapted to bias said moveable contact toward said stationary contact; and wherein said moveable contact is a unitary member including a back portion and a pair of wings extending substantially perpendicular to said back portion.

8. A clamp-jaw contact assembly comprising:

a stationary contact adapted to engage a meter socket cavity;

a moveable contact adapted to engage a meter bayonet;

a unitary member pivotally mounting said moveable contact to said stationary contact and adapted to bias said moveable contact toward said stationary contact; and wherein said unitary member is a spring/pivot member having a general U-shape including a pair of ends disposed from a pair of sides disposed from a bias member, said pair of ends pivotally mounting said moveable contact to said stationary contact; wherein said stationary contact includes a surface; and wherein said moveable contact includes a first portion, which is pivotally mounted to said stationary contact, and a second portion proximate the surface of said stationary contact and adapted to be biased by the bias member of said spring/pivot member.

9. The clamp-jaw contact assembly of claim 8 wherein said stationary contact is elongated and includes a pair of protrusions; wherein the sides of said spring/pivot member engage the protrusions of said stationary contact; wherein said moveable contact pivots about the ends of said spring/pivot member; and wherein the second portion of said moveable contact engages the bias member of said spring/pivot member, in order to maintain said moveable contact in a clamped position with respect to said stationary contact.

10. The clamp-jaw contact assembly of claim 9 wherein the sides of said spring/pivot member are adapted to bend when said moveable contact pivots about the ends of said spring/pivot member, in order to cause said bias member to bias the second portion of said moveable contact toward said stationary contact.

11. A meter socket clamp-jaw contact assembly comprising:

a stationary contact;

a moveable contact;

a unitary spring/pivot member pivotally mounting said moveable contact to said stationary contact and adapted to bias said moveable contact toward said stationary contact; and wherein said stationary contact includes an elongated body and a pair of wings, which extend perpendicular to said elongated body.

12. The meter socket clamp-jaw contact assembly of claim 11 wherein said moveable contact includes a first portion and a second portion; wherein said spring/pivot member includes a first end, which pivotally mounts the first portion of said moveable contact to said stationary contact, and a second end, which engages the second portion of said moveable contact; and wherein the wings of said stationary contact include protrusions, which engage said spring/pivot member, in order that the second end of said spring/pivot member is adapted to bias the second portion of said moveable contact toward said stationary contact.

13. A meter socket clamp-jaw contact assembly comprising:

a stationary contact;

a moveable contact;

a unitary spring/pivot member pivotally mounting said moveable contact to said stationary contact and adapted to bias said moveable contact toward said stationary contact; and wherein said stationary contact is a unitary member including an elongated body portion, a bottom portion disposed from said elongated body portion, and an extension portion disposed from said bottom portion and being generally parallel to said elongated body portion; and wherein said removeable contact is pivotally mounted from said elongated body portion adjacent to said extension portion.

14. The meter socket clamp-jaw contact assembly of claim 13 wherein the bottom portion of said stationary contact includes a pair of sides and a conductor terminal interface, which is disposed from one of said sides.

15. A meter socket clamp-jaw contact assembly comprising:

a stationary contact;

a moveable contact;

a unitary spring/pivot member pivotally mounting said moveable contact to said stationary contact and adapted to bias said moveable contact toward said stationary contact; and wherein said spring/pivot member has a rectangular shape with a pair of ends and an open portion therebetween.

16. The meter socket clamp-jaw contact assembly of claim 15 wherein said spring/pivot member has a general U-shape including a pair of sides disposed from a bottom portion, with each of said ends being disposed from a corresponding one of said sides, and with each of said sides having a bend portion.

17. A meter socket clamp-jaw contact assembly comprising:

a stationary contact;

a moveable contact;

a unitary spring/pivot member pivotally mounting said moveable contact to said stationary contact and adapted to bias said moveable contact toward said stationary contact; and wherein said stationary contact includes an elongated body and a pair of sides, which extend from said elongated body; wherein said moveable contact includes a body portion and a pair of sides, which extend from said body portion; wherein the sides of said stationary contact and said moveable contact have openings; wherein said spring/pivot member has a first end, which passes through a first pair of the openings of a first pair of said sides of said stationary contact and said moveable contact; and wherein said spring/pivot member has a second end, which passes through a second pair of the openings of a second pair of said sides of said stationary contact and said moveable contact.

18. A meter socket clamp-jaw contact assembly comprising:

a stationary contact;

a moveable contact;

a unitary spring/pivot member pivotally mounting said moveable contact to said stationary contact and adapted to bias said moveable contact toward said stationary contact; and wherein said spring/pivot remember has a first end and a second end; wherein said stationary contact includes first and second openings; wherein said moveable contact includes first and second openings; wherein the first end of said spring/pivot member engages the first openings of said stationary contact and said moveable contact; and wherein the second end of said spring/pivot member engages the second openings of said stationary contact and said moveable contact.

* * * * *